(12) United States Patent
Li

(10) Patent No.: US 11,411,149 B2
(45) Date of Patent: Aug. 9, 2022

(54) ARRAY SUBSTRATE, DISPLAY PANEL, AND MANUFACTURING METHOD OF DISPLAY PANEL

(71) Applicant: Shenzhen China Star Optoelectronics Semiconductor Display Technology Co., Ltd., Guangdong (CN)

(72) Inventor: Zhuhui Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 120 days.

(21) Appl. No.: 16/981,719

(22) PCT Filed: Apr. 29, 2020

(86) PCT No.: PCT/CN2020/087713
§ 371 (c)(1),
(2) Date: Sep. 17, 2020

(87) PCT Pub. No.: WO2021/179417
PCT Pub. Date: Sep. 16, 2021

(65) Prior Publication Data
US 2021/0288231 A1    Sep. 16, 2021

(30) Foreign Application Priority Data
Mar. 12, 2020   (CN) .......................... 202010168803.3

(51) Int. Cl.
*H01L 33/58*   (2010.01)
*H01L 33/54*   (2010.01)
*H01L 33/62*   (2010.01)
*H01L 25/075*  (2006.01)
*H01L 27/12*   (2006.01)
*H01L 29/786*  (2006.01)

(52) U.S. Cl.
CPC .......... *H01L 33/58* (2013.01); *H01L 25/0753* (2013.01); *H01L 27/1214* (2013.01); *H01L 29/78633* (2013.01); *H01L 33/54* (2013.01); *H01L 33/62* (2013.01); *H01L 2933/005* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS 9,257,678 B2 *   2/2016  Nakamura .......... H01L 51/5284
2013/0313600 A1 * 11/2013 Cheng ............... G02F 1/133514
                                                      257/98
2014/0166995 A1   6/2014  Lee et al.

FOREIGN PATENT DOCUMENTS

| CN | 108878626 | 11/2018 |
| CN | 110112141 | 8/2019  |
| CN | 209496866 | 10/2019 |
| CN | 110416225 | 11/2019 |

* cited by examiner

*Primary Examiner* — Robert K Carpenter

(57) ABSTRACT

The present invention discloses an array substrate, a display panel, and a manufacturing method of the display panel. The display panel includes the array substrate and a light-emitting element. The array substrate includes a substrate layer, a driving circuit layer, and a cover layer stacked in order from bottom to top. The cover layer is a gray light-absorbing material for absorbing ambient light and reflected light of the driving circuit layer.

7 Claims, 3 Drawing Sheets

ARRAY SUBSTRATE, DISPLAY PANEL, AND MANUFACTURING METHOD OF DISPLAY PANEL

RELATED APPLICATIONS

This application is a National Phase of PCT Patent Application No. PCT/CN2020/087713 having International filing date of Apr. 29, 2020, which claims the benefit of priority of Chinese Patent Application No. 202010168803.3 filed on Mar. 12, 2020. The contents of the above applications are all incorporated by reference as if fully set forth herein in their entirety.

FIELD AND BACKGROUND OF THE INVENTION

The present invention is related to the field of display technology, and specifically, to an array substrate, a display panel, and a manufacturing method of the display panel.

In recent years, display industry has developed rapidly, especially in China's display industry, which has undergone tremendous changes. Through introduction of technology, talents, and advanced equipment and innovation of core technology, China has become the world's largest display manufacturing country, with display level reaching world-leading level, not only ending a dilemma of lack of displays in China, but also leading trends of the display industry.

In the display industry, competition is becoming more and more fierce, and update cycle is shortening. Competition between liquid crystal displays (LCDs) and organic light-emitting diodes (OLEDs) is particularly fierce. With maturity of OLED technology and materials and increase of yield, the LCDs have gradually lost their market advantage in small size, especially in mobile phone market, and the OLEDs have gradually replaced a status of the LCDs. In recent years, many new display technologies have emerged, such as QLED displays, E-inks, flexible LCDs, PE displays, mini-LEDs, micro-LEDs, etc. These new technologies are not yet mass-producible due to problems such as cost, lifespan, and reliability. The micro-LEDs have been vigorously promoted by many companies due to their advantages of wide color gamut, high contrast, quick response times, high resolution, and long life, and at a same time, they are regarded as the most promising new display technology for a next generation.

There are still many defects in light-emitting devices of the micro-LEDs, such as uneven brightness, reliability, low transfer yield, poor TFT uniformity, cross color, color mixing, and poor contrast. The micro-LEDs have problems of cross color, color mixing, and poor contrast because a micro-LED chip is a multi-faceted luminous body. Only light emitted from a top of the micro-LED chip is needed. When adjacent micro-LED chips emit light at a same time, the light emitted from side surfaces will interfere with each other, causing the problems such as cross color, color mixing, and poor contrast. Furthermore, poor contrast is also related to panel metals of the micro-LEDs reflecting ambient light. Therefore, we can start from two aspects of controlling light-emitting directions of the micro-LED chips and reducing reflectivity of the panel metals to solve the problems of cross color, color mixing, and poor contrast of the micro-LEDs. Currently, a common method for improving the problems of cross color, color mixing, and poor contrast of the micro-LEDs are as follows: a first method is to use a micro-LED chip with higher luminous efficiency to increase contrast, which has disadvantages of large power consumption and poor uniformity; a second method is to dispose a black matrix (BM) between the micro-LED chips for light-shielding to reduce cross color, color mixing, and poor contrast, which has disadvantages in that a black matrix process is difficult and the black matrix is likely to remain on copper electrodes; a third method is to encapsulate the side surfaces of the micro-LED chips to block light on the side surfaces, thereby reducing the problems of cross color, color mixing, and poor contrast, which has disadvantages of a reduction in brightness of the micro-LED chips and a great increase in power consumption; and a fourth method is to dispose a polarizer to increase contrast, which has a disadvantage of an increase in costs.

Therefore, it is indeed necessary to develop a new array substrate, a display panel, and a manufacturing method of the display panel to overcome defects in the prior art.

SUMMARY OF THE INVENTION

A purpose of the present invention is to provide an array substrate, a display panel, and a manufacturing method of the display panel. By forming a cover layer on the array substrate, the cover layer can not only absorb ambient light and light emitted by a light-emitting element, but also greatly improves problems of cross color, color mixing, and poor contrast of the display panel without disposing a polarizer. This makes a dark state of the display panel darker, thereby increasing the contrast. Also, a process of forming the cover layer is simple, which reduces manufacturing costs.

In order to solve the above purpose, an embodiment of the present invention provides an array substrate including a substrate layer, a driving circuit layer, and a cover layer stacked in order from bottom to top. The cover layer is a gray light-absorbing material for absorbing ambient light and reflected light of the driving circuit layer.

Furthermore, the driving circuit layer includes a light-shielding layer, a buffer layer, an active layer, a gate insulating layer, a gate metal layer, an interlayer insulating layer, a source/drain metal layer, a planarization layer, and a conductive layer. Specifically, the buffer layer is disposed on the light-shielding layer. The active layer is disposed on the buffer layer. The gate insulating layer is disposed on the active layer. The gate metal layer is disposed on the gate insulating layer. The interlayer insulating layer is disposed on the buffer layer and fully covers the active layer, the gate insulating layer, and the gate metal layer. The source/drain metal layer is disposed on the interlayer insulating layer. The planarization layer is disposed on the interlayer insulating layer and fully covers the source/drain metal layer. The conductive layer is disposed on the planarization layer.

Furthermore, the source/drain metal layer includes a source, a drain, and a floating wiring layer. The source and the drain are electrically connected to a doped region of the active layer. The conductive layer includes an anode segment and a cathode segment. The anode segment is electrically connected to the drain. The cathode segment is electrically connected to the floating wiring layer.

Furthermore, the cover layer is provided with a groove. The groove exposes the anode segment and the cathode segment.

The present further provides a display panel including the above array substrate and a light-emitting element. The light-emitting element is disposed in a groove on the cover layer. The light-emitting element includes an anode and a cathode. The anode is electrically connected to the anode segment. The cathode is electrically connected to the cathode segment.

Furthermore, a depth of the groove is less than or equal to a height of the light-emitting element.

Furthermore, the light-emitting element includes an LED lamp bead or a micro-LED chip.

Furthermore, the display panel further includes an encapsulation layer disposed on the cover layer and fully covering the light-emitting element.

The present invention further provides a manufacturing method of a display panel including steps of:

forming an array substrate, wherein the array substrate includes a substrate layer, a driving circuit layer, and a cover layer stacked in order from bottom to top, the driving circuit layer includes a conductive layer, the conductive layer includes an anode segment and a cathode segment, the cover layer is a gray light-absorbing material for absorbing ambient light and reflected light of the driving circuit layer, the cover layer is provided with a groove, and the groove exposes the anode segment and the cathode segment; and disposing a light-emitting element, wherein the light-emitting element is embedded in the groove on the cover layer, the light-emitting element includes an anode and a cathode, the anode is electrically connected to the anode segment by solder paste welding, and the cathode is electrically connected to the cathode segment by solder paste welding.

Furthermore, the step of forming the array substrate includes steps of:

forming the substrate layer;

forming the driving circuit layer on the substrate layer; and forming the cover layer on the driving circuit layer and forming the groove at positions corresponding to the anode segment and the cathode segment through an exposure process, a development process, and a curing process, wherein a depth of the groove is less than or equal to a height of the light-emitting element.

The beneficial effect of the present invention is to provide the array substrate, the display panel, and the manufacturing method of the display panel. By forming the cover layer on the array substrate, the cover layer can not only absorb the ambient light and light emitted by the light-emitting element, but also greatly improves problems of cross color, color mixing, and poor contrast of the display panel without disposing a polarizer. This makes a dark state of the display panel darker, thereby increasing contrast. Also, a process of forming the cover layer is simple, which reduces manufacturing costs and greatly increases competitiveness of products.

Figure 1:
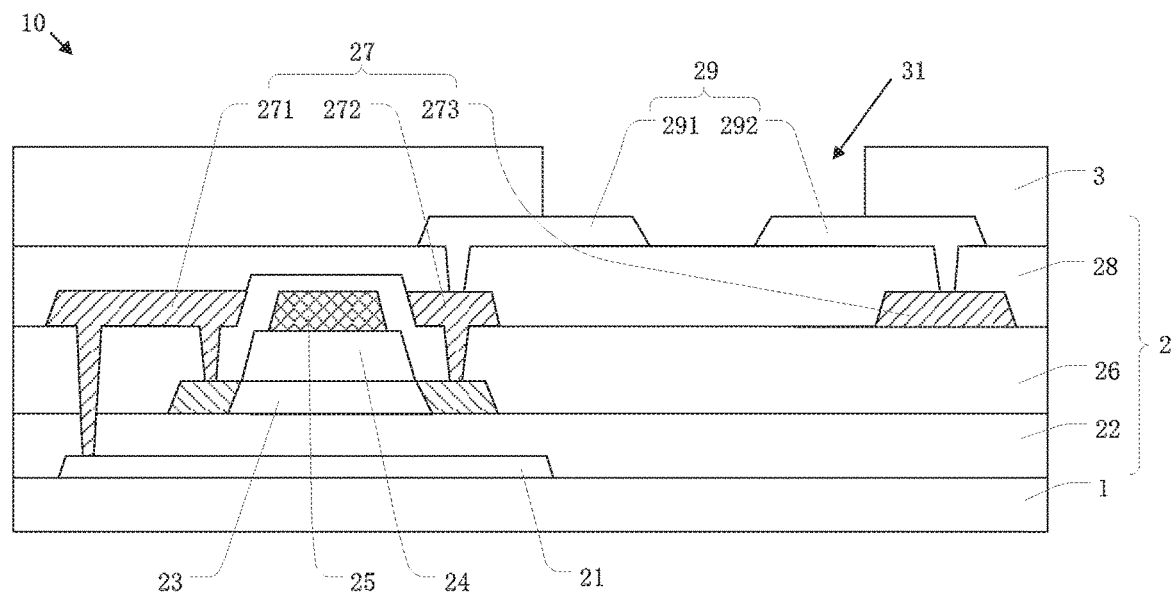
FIG. 1 is a structural diagram of an array substrate in an embodiment of the present invention.

REFERENCE SIGNS substrate layer 1, driving circuit layer 2, cover layer 3, light-emitting element 4, encapsulation layer 5, array substrate 10, light-shielding layer 21, buffer layer 22, active layer 23, gate insulating layer 24, gate metal layer 25, interlayer insulating layer 26, source/drain metal layer 27, planarization layer 28, conductive layer 29, groove 31, anode 41, cathode 42, light-emitting layer 43, display panel 100, source 271, drain 272, floating wiring layer 273, anode segment 291, and cathode segment 292.

DESCRIPTION OF SPECIFIC EMBODIMENTS OF THE INVENTION

To further explain the technical means and effects of the present invention, the following refers to embodiments and drawings for detailed description. Obviously, the described embodiments are only for some embodiments of the present invention, instead of all embodiments. Based on the embodiments of the present invention, all other embodiments obtained by those skilled in the art without creative work fall into a protection scope of the present invention.

In the drawings, components with same structure are denoted by same numerals, and components with similar structures or functions are denoted by similar numerals. In the description of the present invention, it is to be understood that the terms "up," "down," "front," "back," "left," "right," "inside," "outside," "topside," "underside," "side," "top," "bottom," "front end," "back end," "terminal," and the like, indicate orientations or positional relationships, and are based on the orientations or positional relationships shown in the drawings, therefore may not be construed as limits to the present invention.

When some part is described to be "on" another part, the part may be directly disposed on the other part; alternatively, an intervening part may exist, the part is disposed on the intervening part, and the intervening part is disposed on the other part. When a part is described to be "installed on" or "connected to" another part, it may be understood that the parts are directly "installed" or "connected" to each other, alternatively it is understood that one part is "installed" or "connected" to the other part through an intervening part.

Please refer to FIG. 1, an embodiment of the present invention provides an array substrate 10 including a substrate layer 1, a driving circuit layer 2, and a cover layer 3 stacked in order from bottom to top. The cover layer 3 is a gray light-absorbing material for absorbing ambient light and reflected light of the driving circuit layer 2 and prevents the display panel composed of the array substrate 10 from problems of cross color and color mixing, which makes a dark state of the display panel 100 darker, thereby increasing contrast.

Please refer to FIG. 1, the driving circuit layer 2 includes a light-shielding layer 21, a buffer layer 22, an active layer 23, a gate insulating layer 24, a gate metal layer 25, an interlayer insulating layer 26, a source/drain metal layer 27, a planarization layer 28, and a conductive layer 29. Specifically, the buffer layer 22 is disposed on the light-shielding layer 21. The active layer 23 is disposed on the buffer layer 22. The gate insulating layer 24 is disposed on the active layer 23. The gate metal layer 25 is disposed on the gate insulating layer 24. The interlayer insulating layer 26 is disposed on the buffer layer 22 and fully covers the active layer 23, the gate insulating layer 24, and the gate metal layer 25. The source/drain metal layer 27 is disposed on the interlayer insulating layer 26. The planarization layer 28 is disposed on the interlayer insulating layer 26 and fully covers the source/drain metal layer 27. The conductive layer 29 is disposed on the planarization layer 28.

Please refer to FIG. 1, the source/drain metal layer 27 includes a source 271, a drain 272, and a floating wiring layer 273. The source 271 and the drain 272 are electrically connected to a doped region of the active layer 23. The conductive layer 29 includes an anode segment 291 and a cathode segment 292. The anode segment 291 is electrically connected to the drain 272. The cathode segment 292 is electrically connected to the floating wiring layer 273. During operation, the drain 272 is connected to a positive electrode of a power supply, and current is conducted from the active layer 23 to the drain 272 through the drain electrode 272 and then to the anode segment 291. The floating wiring layer 273 is connected to a negative electrode of the power supply, and electrons are conducted to the cathode segment 292 through the floating wiring layer 273.

As shown in FIG. 1, in this embodiment, the source 271 is further electrically connected the light-shielding layer 21.

Please refer to FIG. 1, the cover layer 3 is provided with a groove 31. The groove 31 exposes the anode segment 291 and the cathode segment 292 to facilitate subsequent electrical connection between the anode segment 291 and the cathode segment 292 and a light-emitting element.

Figure 2:
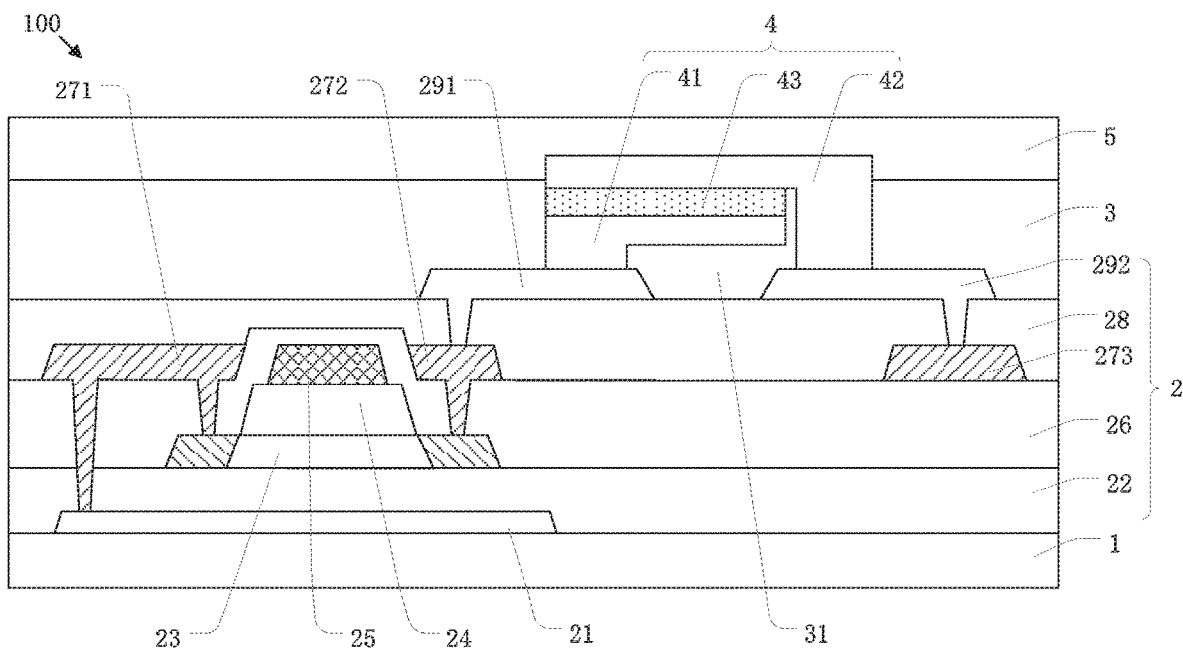
FIG. 2 is a structural diagram of a display panel in an embodiment of the present invention.

Please refer to FIG. 2, the present invention further provides a display panel including the above array substrate 10 and a light-emitting element 4. The light-emitting element 4 is disposed in the groove 31 on the cover layer 3. The light-emitting element 4 includes an anode 41 and a cathode 42. Between the anode 41 and the cathode 42 is a light-emitting layer 43. The anode 41 is electrically connected to the anode segment 291. The cathode 42 is electrically connected to the cathode segment 292. The cover layer 3 is a gray light-absorbing material for absorbing ambient light and reflected light of the driving circuit layer 2 and prevents the display panel from problems of cross color and color mixing, which makes a dark state of the display panel 100 darker, thereby increasing contrast.

Please refer to FIGS. 1 and 2, during operation, the drain 272 is connected to a positive electrode of a power supply, and current is conducted from the active layer 23 to the drain 272 through the drain electrode 272 and then to the anode segment 291 to conduct with the anode 41 of the light-emitting element 4. The floating wiring layer 273 is connected to a negative electrode of the power supply, and an electrical signal is conducted to the cathode segment 292 through the floating wiring layer 273 to conduct with the cathode 42 of the light-emitting element 4, thereby making the light-emitting element 4 emit light.

In this embodiment, a depth of the groove 31 is less than or equal to a height of the light-emitting element 4, which facilitates embedding of the light-emitting element 4 into the groove 31.

In this embodiment, the light-emitting element 4 includes an LED lamp bead or a micro-LED chip. The LED lamp bead can also be called an LED chip, which is usually used in a backlight module of a liquid crystal display device as a light-emitting element on a light bar. Size of the micro-LED chip is smaller than that of the LED lamp bead, and it can be used in an LED display device. Exemplarily, a single independent micro-LED chip can be formed, and then the micro-LED chip is electrically connected to one side surface of a base substrate by batch transfer technology or mass transfer technology to form the display panel 100.

In another embodiment, the light-emitting element 4 can also be other types of light-emitting structures known to those skilled in the art, which is not limited in this embodiment of the present invention.

Please refer to FIG. 2, the display panel 100 further includes an encapsulation layer 5 disposed on the cover layer 3 and fully covering the light-emitting element 4 for blocking water and oxygen.

Figure 3:
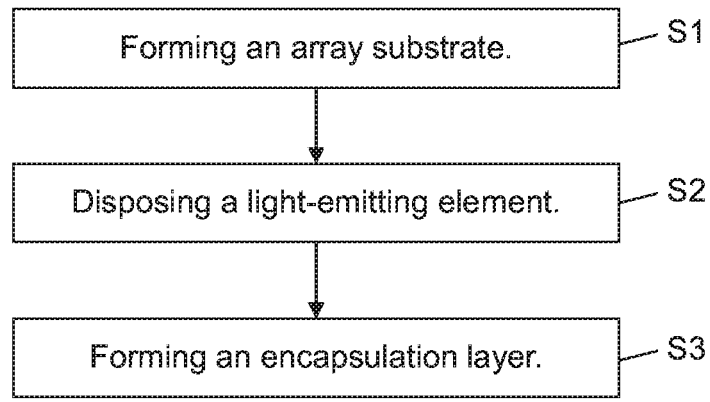
FIG. 3 is a flowchart of a manufacturing method of the display panel in an embodiment of the present invention.

Please refer to FIG. 3, the present invention further provides a manufacturing method of the display panel 100 including steps of:

S1, forming an array substrate 10, wherein the array substrate 10 includes a substrate layer 1, a driving circuit layer 2, and a cover layer 3 stacked in order from bottom to top, the driving circuit layer 2 includes a conductive layer 29, the conductive layer 29 includes an anode segment 291 and a cathode segment 292, the cover layer 3 is a gray light-absorbing material for absorbing ambient light and reflected light of the driving circuit layer 2, the cover layer 3 is provided with a groove 31, and the groove 31 exposes the anode segment 291 and the cathode segment 292; and S2, disposing a light-emitting element 4, wherein the light-emitting element 4 is embedded in the groove 31 on the cover layer 3, the light-emitting element 4 includes an anode 41 and a cathode 42, the anode 41 is electrically connected to the anode segment 291 by solder paste welding, and the cathode 42 is electrically connected to the cathode segment 292 by solder paste welding.

Figure 4:
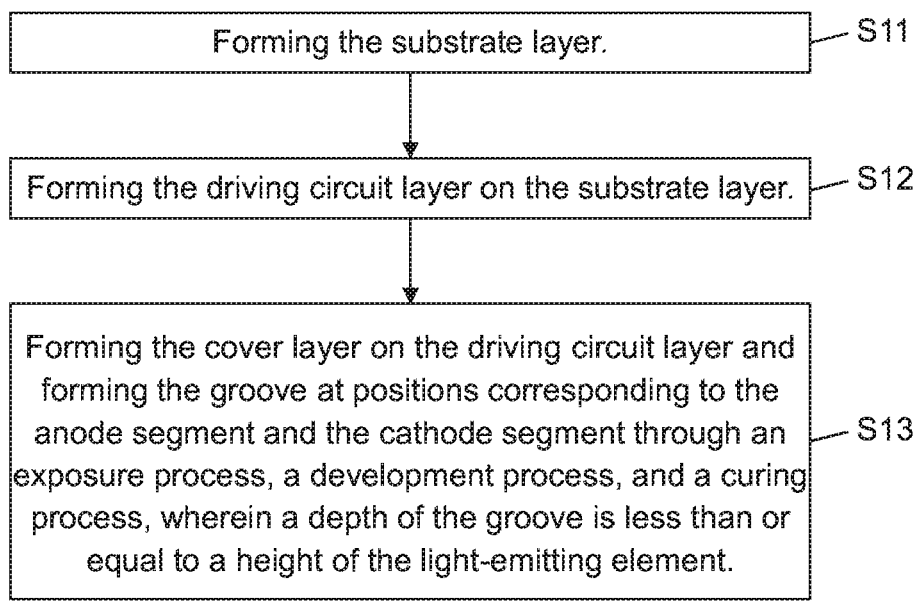
FIG. 4 is a flowchart of forming a source/drain metal layer in FIG. 3.

Please refer to FIG. 4, the step S1 of forming an array substrate 10 includes steps of:

S11, forming the substrate layer 1;

S12, forming the driving circuit layer 2 on the substrate layer 1;

S13, forming the cover layer 3 on the driving circuit layer 2 and forming the groove 31 at positions corresponding to the anode segment 291 and the cathode segment 292 through an exposure process, a development process, and a curing process, wherein a depth of the groove 31 is less than or equal to a height of the light-emitting element 4, which facilitates embedding of the light-emitting element 4 into the groove 31.

Figure 5:
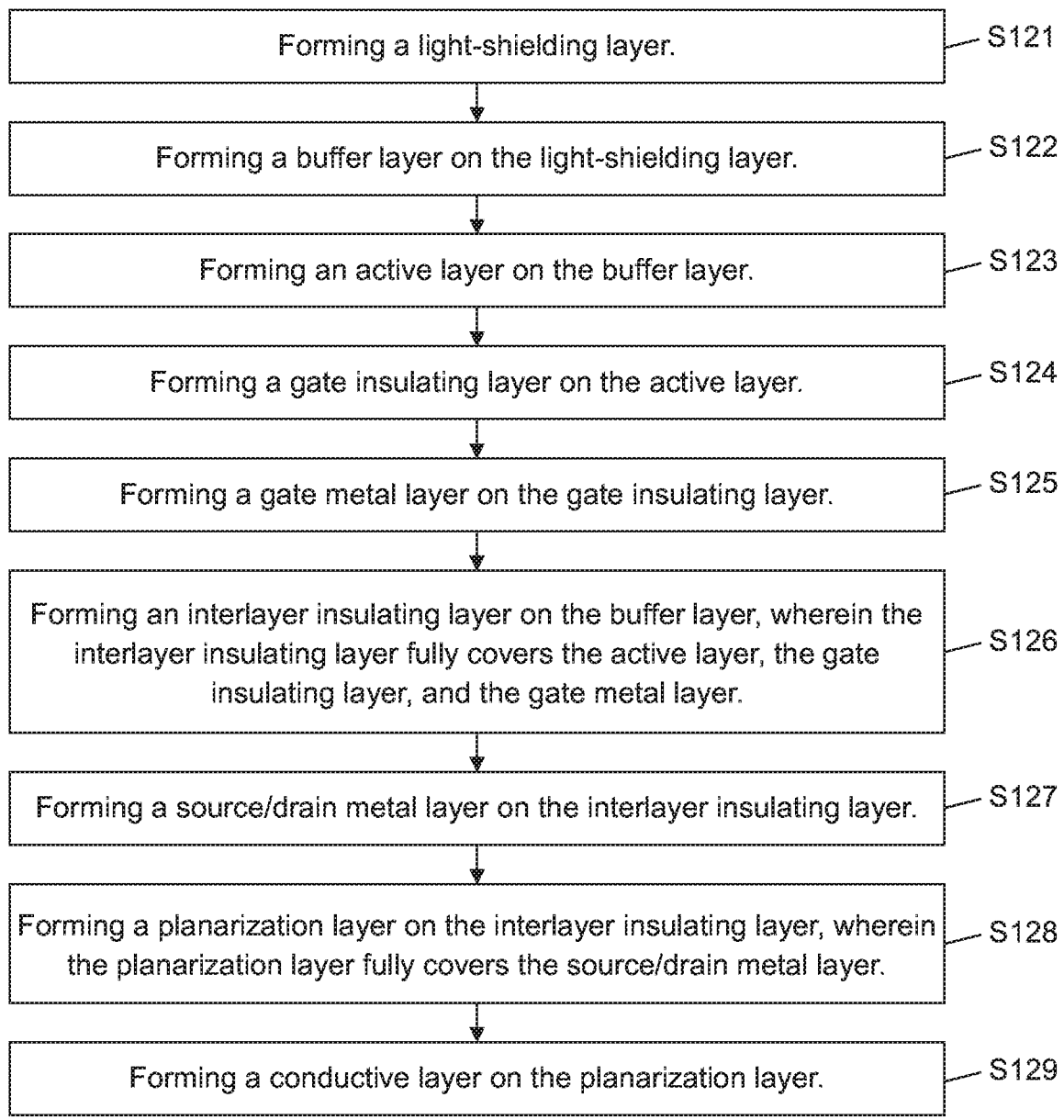
FIG. 5 is a flowchart of forming a driving circuit layer in FIG. 3.

Please refer to FIG. 5, the step S12 of forming the driving circuit layer 2 includes steps of:

S121, forming a light-shielding layer 21;

S122, forming a buffer layer 22 on the light-shielding layer 21;

S123, forming an active layer 23 on the buffer layer 22;

S124, forming a gate insulating layer 24 on the active layer 23;

S125, forming a gate metal layer 25 on the gate insulating layer 24;

S126, forming an interlayer insulating layer 26 on the buffer layer 22, wherein the interlayer insulating layer 26 fully covers the active layer 23, the gate insulating layer 24, and the gate metal layer 25;

S127, forming a source/drain metal layer 27 on the interlayer insulating layer 26;

S128, forming a planarization layer 28 on the interlayer insulating layer 26, wherein the planarization layer 28 fully covers the source/drain metal layer 27; and S129, forming a conductive layer 29 on the planarization layer 28.

Please refer to FIG. 1, the source/drain metal layer 27 includes a source 271, a drain 272, and a floating wiring layer 273. The source 271 and the drain 272 are electrically connected to a doped region of the active layer 23. The conductive layer 29 includes an anode segment 291 and a cathode segment 292. The anode segment 291 is electrically connected to the drain 272. The cathode segment 292 is electrically connected to the floating wiring layer 273. During operation, the drain 272 is connected to a positive electrode of a power supply, and current is conducted from the active layer 23 to the drain 272 through the drain electrode 272 and then to the anode segment 291. The floating wiring layer 273 is connected to a negative electrode of the power supply, and electrons are conducted to the cathode segment 292 through the floating wiring layer 273.

Please refer to FIG. 3, after the step S2 of disposing a light-emitting element 4, the manufacturing method further includes the step of:

S3, forming an encapsulation layer 5 on the cover layer 3, wherein the encapsulation layer 5 fully covers the light-emitting element 4 for blocking water and oxygen.

The beneficial effect of the present invention is to provide the array substrate 10, the display panel 100, and the manufacturing method of the display panel 100. By forming the cover layer 3 on the array substrate 10, the cover layer 3 can not only absorb the ambient light and light emitted by the light-emitting element 4, but also greatly improves problems of cross color, color mixing, and poor contrast of the display panel 100 without disposing a polarizer. This makes a dark state of the display panel 100 darker, thereby increasing the contrast. Also, a process of forming the cover layer 3 is simple, which reduces manufacturing costs and greatly increases competitiveness of products.

Although the present invention has been disclosed above by the preferred embodiments, the preferred embodiments are not intended to limit the invention. One of ordinary skill in the art, without departing from the spirit and scope of the present invention, can make various modifications and variations of the present invention. Therefore, the scope of the claims to define the scope of equivalents.

What is claimed is:

1. An array substrate, comprising:
   a substrate layer;
   a driving circuit layer disposed on the substrate layer, wherein the driving circuit layer comprises:
   a light-shielding layer;
   a buffer layer disposed on the light-shielding layer;
   an active layer disposed on the buffer layer;
   a gate insulating layer disposed on the active layer;
   a gate metal layer disposed on the gate insulating layer;
   an interlayer insulating layer disposed on the buffer layer and fully covering the active layer, the gate insulating layer, and the gate metal layer;
   a source/drain metal layer disposed on the interlayer insulating layer;
   a planarization layer disposed on the interlayer insulating layer and fully covering the source/drain metal layer; and
   a conductive layer disposed on the planarization layer; and
   a cover layer disposed on the driving circuit layer, wherein the cover layer is a gray light-absorbing material for absorbing ambient light and reflected light of the driving circuit layer;
   wherein the source/drain metal layer comprises a source, a drain, and a floating wiring layer, and the source and the drain are electrically connected to a doped region of the active layer;
   wherein the conductive layer comprises an anode segment and a cathode segment, the anode segment is electrically connected to the drain, and the cathode segment is electrically connected to the floating wiring layer;
   wherein the cover layer is provided with a groove, and the groove exposes the anode segment and the cathode segment.

2. A display panel, comprising:
   the array substrate according to claim 1; and
   a light-emitting element disposed in a groove on the cover layer, wherein the light-emitting element comprises an anode and a cathode, the anode is electrically connected to an anode segment, and the cathode is electrically connected to a cathode segment.

3. The display panel according to claim 2, wherein a depth of the groove is less than or equal to a height of the light-emitting element.

4. The display panel according to claim 2, wherein the light-emitting element comprises an LED lamp bead or a micro-LED chip.

5. The display panel according to claim 2, further comprising:
   an encapsulation layer disposed on the cover layer and fully covering the light-emitting element.

6. A manufacturing method of a display panel, comprising steps of:
   forming an array substrate, wherein the array substrate comprises a substrate layer, a driving circuit layer, and a cover layer stacked in order from bottom to top, the driving circuit layer comprises a conductive layer, the conductive layer comprises an anode segment and a cathode segment, the cover layer is a gray light-absorbing material for absorbing ambient light and reflected light of the driving circuit layer, the cover layer is provided with a groove, and the groove exposes the anode segment and the cathode segment; and
   disposing a light-emitting element, wherein the light-emitting element is embedded in the groove on the cover layer, the light-emitting element comprises an anode and a cathode, the anode is electrically connected to the anode segment by solder paste welding, and the cathode is electrically connected to the cathode segment by solder paste welding.

7. The manufacturing method of the display panel according to claim 6, wherein the step of forming the array substrate comprises steps of:
   forming the substrate layer;
   forming the driving circuit layer on the substrate layer; and
   forming the cover layer on the driving circuit layer and forming the groove at positions corresponding to the anode segment and the cathode segment through an exposure process, a development process, and a curing process, wherein a depth of the groove is less than or equal to a height of the light-emitting element.

* * * * *